(12) United States Patent
Lester

(10) Patent No.: US 6,258,618 B1
(45) Date of Patent: Jul. 10, 2001

(54) LIGHT EMITTING DEVICE HAVING A FINELY-PATTERNED REFLECTIVE CONTACT

(75) Inventor: Steven D. Lester, Palo Alto, CA (US)

(73) Assignee: Lumileds Lighting, US, LLC, San Jose, CA (US)

( * ) Notice: Subject to any disclaimer, the term of this patent is extended or adjusted under 35 U.S.C. 154(b) by 0 days.

(21) Appl. No.: 09/483,293

(22) Filed: Jan. 14, 2000

Related U.S. Application Data

(62) Division of application No. 09/151,554, filed on Sep. 11, 1998, now abandoned.

(51) Int. Cl.[7] ................................................. H01L 21/00
(52) U.S. Cl. ................................. 438/46; 438/22; 438/47
(58) Field of Search .................................. 438/22, 46, 47

(56) References Cited

U.S. PATENT DOCUMENTS 5,909,459 * 6/1999 Ishibashi et al. ..................... 372/96
5,917,202 * 6/1999 Haitz et al. ........................... 257/98
5,994,723 * 11/1999 Sekii et al. ........................... 257/99
6,107,644 * 8/2000 Shakuda et al. ..................... 257/79

* cited by examiner

*Primary Examiner*—Long Pham
(74) *Attorney, Agent, or Firm*—Skjerven Morrill Macpherson LLP; Brian D. Ogonowsky; Jenny K. Sung

(57) ABSTRACT

The invention is an AlInGaN light-emitting device (LED) that includes a p-type contact made of highly-reflective material with closely-spaced openings that increase light extraction efficiency. The minimum dimension of the openings is ¼ of the wavelength of the emitted light and is preferably comparable to the distance current flows laterally in the p-layers of the device. The openings in the metal occupy 20–80% of the top surface of the contact and are finely spaced to achieve transparency and uniform light emission. An optional dielectric encapsulant may be deposited over the p-type contact to improve the contact's adhesion by tacking it down at regular intervals, and to improve light extraction. The surface of the epitaxial layers may be etched in the openings to scatter light in the semiconductor, increasing light extraction. A reflective layer may be applied to the bottom surface of the LED to increase the light extraction efficiency.

5 Claims, 5 Drawing Sheets

LIGHT EMITTING DEVICE HAVING A FINELY-PATTERNED REFLECTIVE CONTACT

This is a divisional of application Ser. No. 09/151,554, filed on Sep. 11, 1998, now abandoned.

FIELD OF THE INVENTION

The present invention is directed towards improving light extraction from light emitting devices.

BACKGROUND

Light extraction from a semiconductor light-emitting device (LED) is limited due to the large optical refractive index, (n~2.2–3.8) of the semiconductor material relative to the surrounding ambient, typically air (n~1) or transparent epoxy (n~1.5). The amount of extraction depends heavily on the macroscopic geometry of the LED and the three-dimensional emission profile of light generated within the active region or light-emitting layer. Before it can escape, most of the light generated within the device is attenuated by the absorbance in the surrounding materials, e.g. epitaxial layers, confining regions, substrate, die attach materials, and electrical contacts.

Typical devices generate photons at the p-n junction that are emitted into a wide range of directions (nearly isotropic emission). As a result, a large percentage of emitted light rays are incident at the device/ambient interface at angles greater than the critical angle for exiting the semiconductor. These rays are internally reflected and are susceptible to absorption within the device. For a typical GaN-based LED, only~11% of photons are incident on the top surface within the critical angle (for transmission into epoxy). The remaining light undergoes at least one internal reflection before escaping the chip.

The internally-reflected light in AlInGaN LEDs is particularly susceptible to absorption by the p-layer contact. These contacts must cover essentially the entire p-n junction emitting area because current cannot spread laterally in the semiconductor layers. Since the conductivity of the p-type epitaxial layers is extremely low, typically >20000 $\Omega$/square, current is confined to directly under the contact metal or to within ~1 $\mu$m of the contact edge.

To allow light to escape, AlInGaN LEDs use p- contacts made with extremely thin metal layers. They are typically between 50 and 500 Å thick and made from AuNi or similar alloys. While these thin, 'semi-transparent' layers pass most of the light that strikes them near normal incidence, typically greater than 20% of this light is absorbed.

There are several problems with semi-transparent contacts. First, the contacts absorb a large fraction of the LED light. Although they can pass as much as~80% of light at near-normal incidence, they are relatively absorptive at angles greater than the critical angle (for light to escape from the LED). Since most LED light is internally reflected, it encounters the partially absorbing contact many times. For LEDs made on sapphire substrates,~70% of the emitted light becomes trapped between the absorptive metal surface and the substrate. Since the contact metal rapidly attenuates the intensity of this light, these semi-transparent metal films can absorb the majority of the emitted light.

A second problem is that because the semi-transparent metal films are extremely thin, on the order of a few hundred angstroms, the films do not completely cover rough semiconductor surfaces. This is particularly disadvantageous since rough surfaces can improve light extraction. Semi-transparent films do not conduct current evenly over rough or uneven surfaces and can become discontinuous. This causes the LED to emit light unevenly, or not at all in portions of the device.

A third problem with thin metals is that they are easily scratched, hence creating a discontinuous conducting surface. This makes them difficult to handle, complicating the LED fabrication process.

SUMMARY OF THE INVENTION

The present invention is a AlInGaN light-emitting device that includes a finely-patterned, reflective p-contact that increases light extraction efficiency. These contacts allow light to pass through them because they contain an array of closely spaced openings. Thus, light impinging on the contacts either passes through the openings or is reflected back into the LED with very little loss. This significantly reduces the absorption of light that occurs in conventional semi-transparent contacts. The contact provides low-resistance current spreading (even over rough semiconductor surfaces) since it can be made of thick, highly conducting metal. Openings in the contact metal occupy 20–80% of the overall contact area, and are finely space to achieve transparency and uniform light emission. The contact is made from highly reflective material such as Ag, Al, or Rh. This insures that light that does not pass through the contact is reflected with very little optical absorption. An optional dielectric encapsulant, e.g. silicon dioxide, silicon nitride, aluminum nitride, or aluminum oxide, may be deposited over the p-type contact. The surface of the active region may be optionally roughened with etched features that are self-aligned with the openings in the metal. These features scatter internally-reflected light, increasing the opportunities for light extraction. A reflective layer may be applied to the bottom surface of the LED to further improve light-extraction efficiency.

DETAILED DESCRIPTION OF THE PREFERRED EMBODIMENTS

Figure 1:
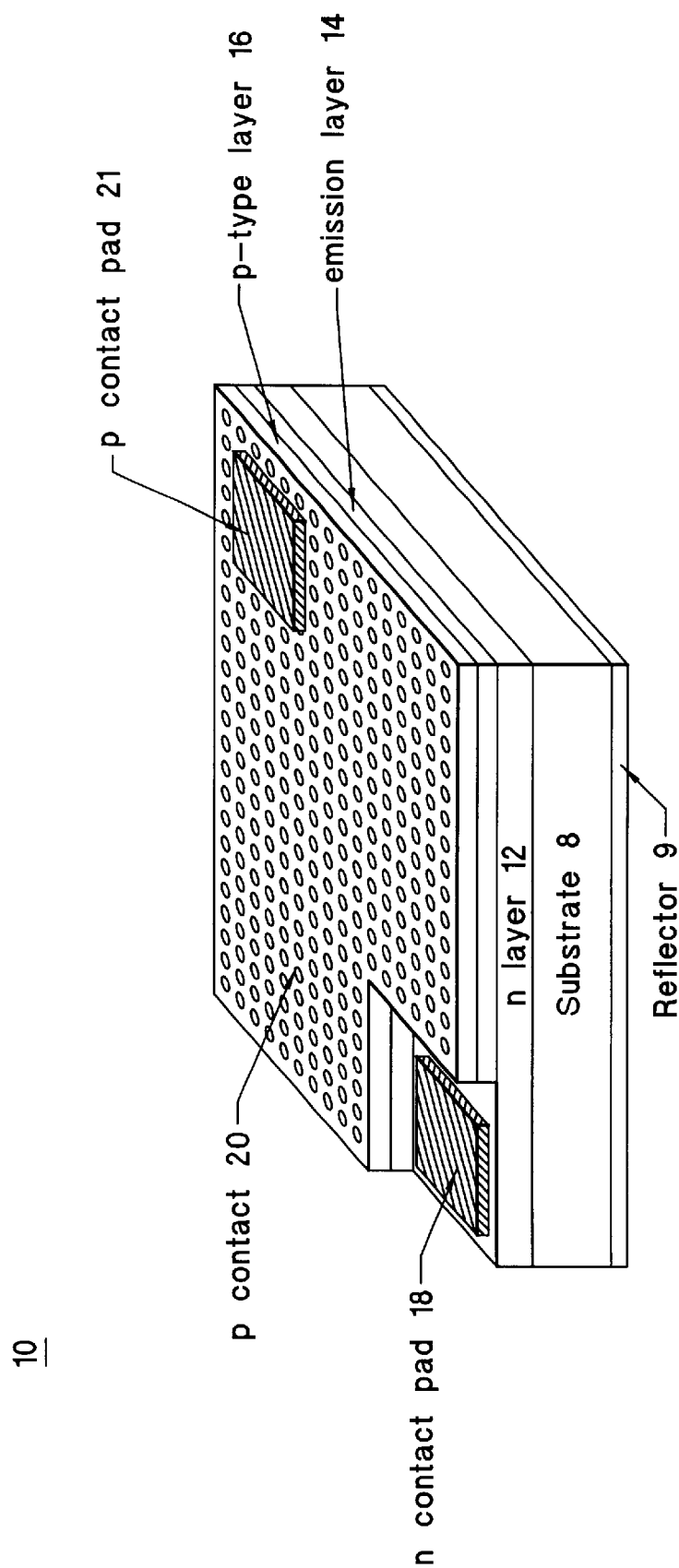
FIG. 1 illustrates a preferred embodiment of the present invention.

A typical GaN-based LED includes a hetero-junction structure having an emission layer sandwiched between an n-type layer and a p-type layer. A p-type contact is electrically connected to the p-type layer while a n-type contact is electrically connected to the n-type layer. FIG. 1 illustrates an embodiment of the present invention, a hetero-junction device 10, having an emission layer 14 interposing an n-type layer 12 and a p-type layer 16, fabricated on a substrate 8. A reflector 9 is positioned on the backside of the substrate. An n-contact 18 is electrically connected to the n-type layer 12 while the p-contact 20 is electrically connected to the p-type layer 16. Both electrical contacts are preferably made from reflective metals, i.e. metals that reflect greater than 70% of normally incident visible light. A p-bond pad 21 is positioned on the p-contact.

According to the present invention, the p-type contact 20 includes a finely spaced pattern of openings that allows light to pass through the contact. The openings must be small so that the p-n junction can conduct current in the openings (at least partially). To insure light can pass through the contact the opening size must be greater than ~¼ of the wavelength of visible light ($\lambda$) in the material system. To illustrate, $\lambda$ visible light in air ranges from 400–700 nm. Inside GaN, $\lambda$ ranges from 160–285 nm. The minimum dimension for the openings should be at least 160 nm.

The preferred dimension of the opening is determined by current spreading in the p-type layer 16. For the p-n junction 14 to emit light directly under the openings current must flow from the edge of the metal to the junction area beneath the opening. Thus the minimum dimension should be approximately the same as the distance current flows laterally in the LED. Typical AlInGaN devices have p-layers that are 0.25–0.5 $\mu$m thick, with sheet resistivities of >20,000 $\Omega$/square. Thus, current spreads only approximately <1 $\mu$m from the contact edge. Since current flows from contact metals on all sides of the openings, a preferred minimum dimension of the opening is 0.5–2 $\mu$m. Experimental devices have been constructed with p-layers >1 $\mu$m thick. For these diodes, the preferred minimum dimension is 1–4 $\mu$m. The openings should be as large as possible to allow light transmission and ease of fabrication. However, they should not be large compared to the extent of lateral current flow, otherwise areas of the LED will be wasted and the LED will have a "spotty" emission pattern.

The shape of the openings may be regular patterns such as circles, squares, a grid of lines, or honeycombs, or they can be arbitrarily shaped. The metal must be continuously connected around the openings. The openings in the metal contact preferably occupy 20–80% of the overall contact area. Below 20% the contacts do not transmit enough light. This traps photons in the LED making them susceptible to reabsorption. Above 80% there will not be sufficient metal to spread current evenly using metals with feature sizes that can be easily fabricated.

The p-contact metal is preferably a thick layer, e.g. 1000–30,000 Å. This insures the contact will spread the current across the device with low resistance, and that it will effectively cover any surface topography on the wafer. Alternatively, the patterned metal can be made sufficiently thin that it is semi-transparent. In this case, the efficiency of the device is increased by the invention, but the advantages of thick metallization are not realized (such as the ability to conduct over rough surfaces). The conductive material should be a reflective metal, preferably silver, aluminum, rhodium, alloys of Ag, Al, Rh, or multi-layer contacts where Ag, Al, or Rh are constituents that make the reflectivity of the contact >70%. The contacts can be made with less reflective metals such as NiAu, Pd, TiPt; however, LEDs made this way will be less efficient.

The preferred p-contact is a "perforated" silver mesh formed by etching an array of holes in Ag. Silver is used because it has the highest reflectivity among metals and can make a low-resistance ohmic contact to p-type GaN. The n- and p-type bond pads are made from Al because of its high reflectivity (~90%), good adherence to GaN, and because it forms a low-resistance contact with n-type GaN.

In all embodiments, light that is incident on the top surface of the LED either encounters the highly reflective metal or an unmetallized portion of the device. If the light strikes the unmetallized portion, it will escape from the chip or be internally-reflected without attenuation. If the mirror portion is encountered, the light is internally-reflected with minimal attenuation. This light scatters into the device and escapes through the sides of the device, or again is incident on the top surface. Because it is only minimally attenuated, the light may bounce many times and have many opportunities to escape from the chip. Thus thick, semi-continuous metal films improve light-extraction from the LED even though they obscure portions of the top surface.

Typically, LEDs are designed so that the opaque contacts (or contact pads) are as small as possible to minimize obscuration of the surface of the chip. The present invention is a significant departure from the prior art. In this case, light extraction is improved in spite of the obscuration because the ohmic contacts have high reflectivity, the substrate is made with a reflective coating on the back, and the epitaxial materials and substrate do not significantly self-absorb the emitted light. Thus, light travels through the chip many times, having many opportunities to escape without being absorbed.

Because the finely patterned contacts may be much thicker than semi-transparent metals, the sheet resistance of the contact layer is lower as well. This insures that the contact does not cause current crowding in the device. Thicker contacts also cover rough or textured surfaces effectively. As a result the semiconductor surfaces may be intentionally roughened to improve light-extraction. The epitaxial LED films can also be grown under a wider range of conditions. Specifically, layers grown after the p-n junction can be grown at temperatures below 1000 C. This growth temperature range minimizes the thermal damage to the active region that can occur during growth, but results in rough or pitted surfaces that are not easily covered using thin metallization.

Figure 2:
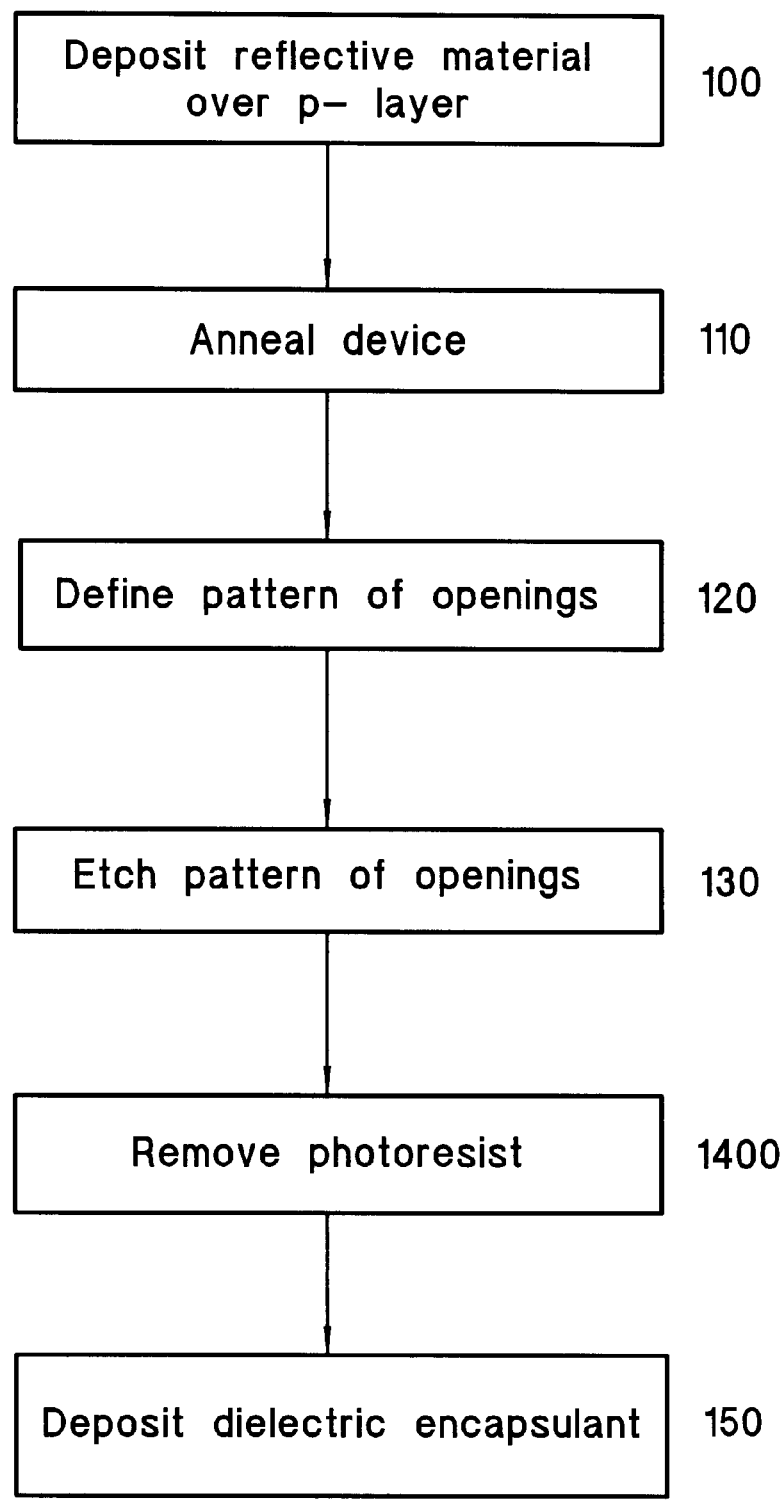
FIG. 2 illustrates a process flowchart for the present invention.

FIG. 2 illustrates a process flowchart to construct the contacts. In step 100, the reflective material is deposited over the p-type layer of the LED. In step 110, the device is annealed. In step 120, resist is deposited and exposed to define the pattern of openings. In step 130, the pattern is etched into the contact metal and optionally the epitaxial layers of the LED. Etching may be achieved via chemical etching, ion milling, reactive ion etching, etc. In step 140, the resist is removed. In step 150, the optional dielectric encapsulant is deposited over the contact.

Another way to form the openings is to anneal the contact at elevated temperatures. Under appropriate conditions surface tension will cause openings to develop in the metal. For example, a 1000 Å thick layer of silver will de-wet the surface of GaN at 600 C., leaving a network of open spaces after several minutes of annealing.

Figure 3:
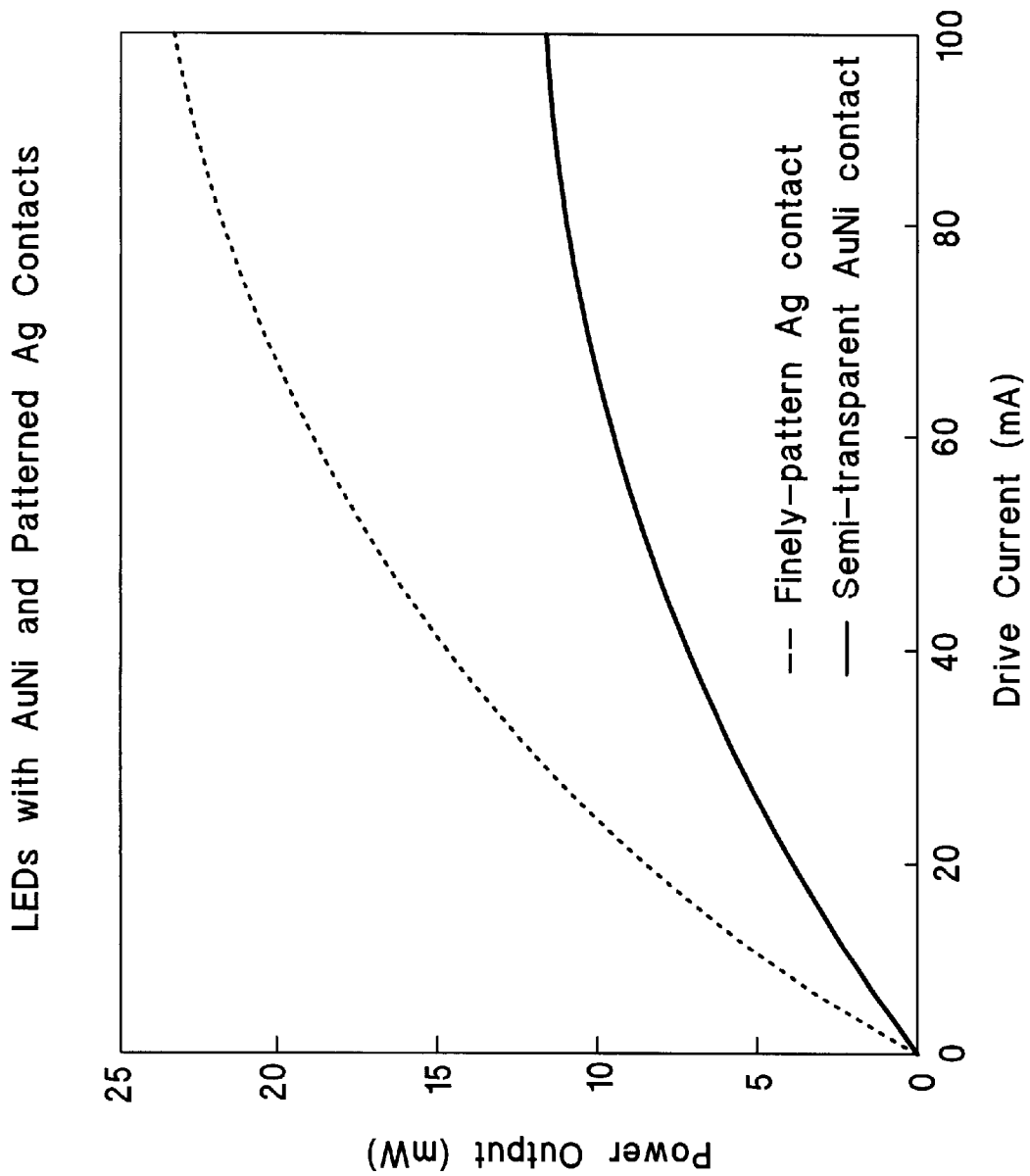
FIG. 3 compares the light efficiency of the present invention to that of the prior art LEDs using semi-transparent AuNi films.

FIG. 3 contrasts the output power as a function of drive current for LEDS fabricated according to the invention and ones fabricated with a conventional AuNi semi-transparent contact. The LEDs fabricated with finely patterned Ag contacts are 1.5–2x more efficient than the prior art LEDs at all currents.

Figure 4:
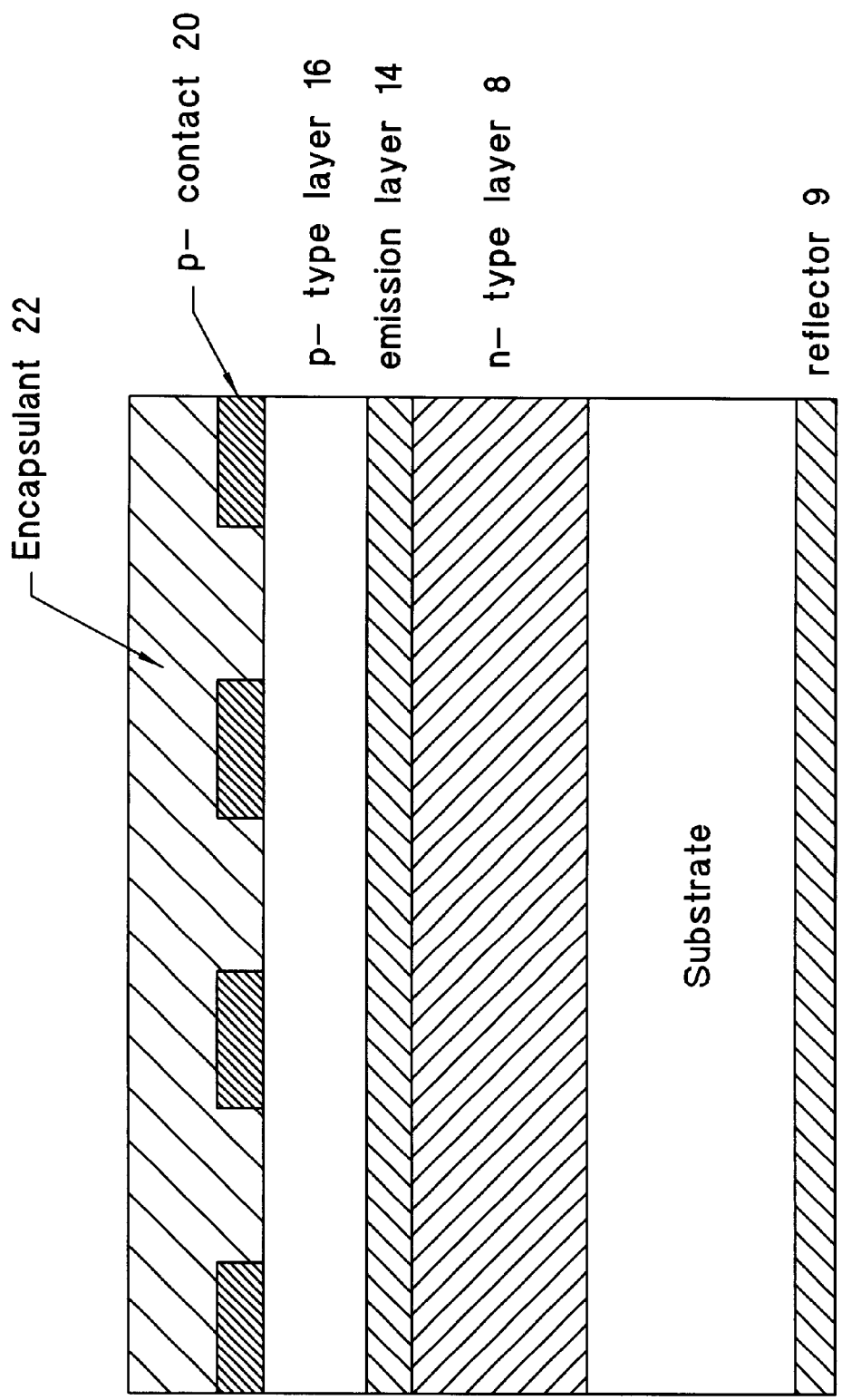
FIG. 4 illustrates another preferred embodiment of the present invention.

FIG. 4 illustrates another preferred embodiment. The top surface has been encapsulated in a dielectric having an index of refraction greater than 1.5, e.g. aluminum oxide, silicon nitride, aluminum nitride, hafnium oxide, or titanium oxide. When this layer 22 has an index of refraction greater than that of the epoxy which surrounds the LED, it increases the probability that light can pass through the openings in the silver layer. The encapsulant allows light to be internally-reflected above rather than below the silver mirror. This increases its chance for escape without attenuation. In addition, the encapsulant improves the adhesion of the metal film to the LED surface by tacking down the metal at the open spaces across the surface. This is particularly advantageous if the contact is made of silver. The dielectric also protects the metal layer from scratches that may occur during fabrication, and protects it from environmental degradation, e.g. oxidation or tarnishing.

Figure 5:
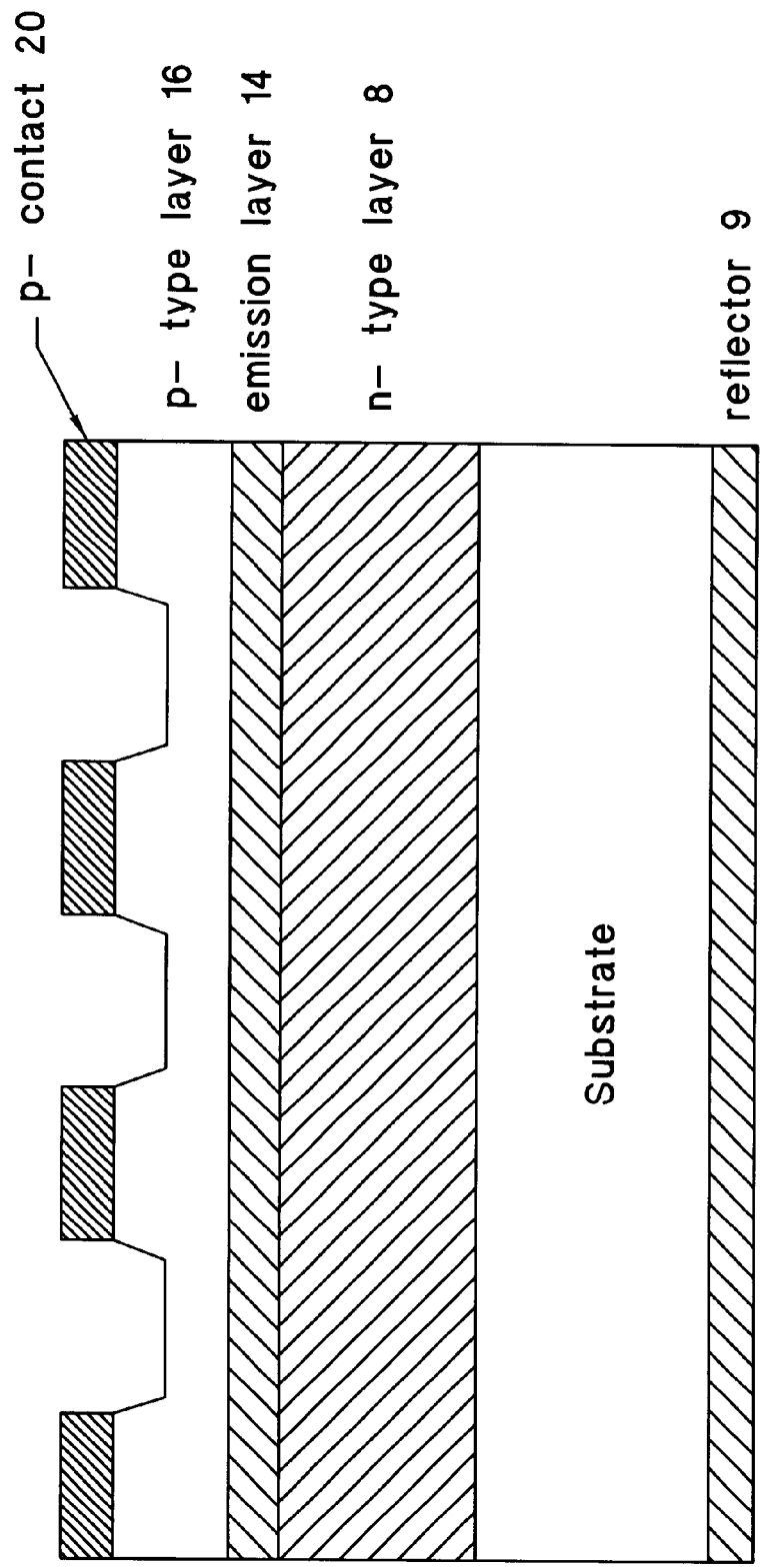
FIG. 5 illustrates another preferred embodiment of the present invention.

FIG. 5 illustrates another preferred embodiment. The top surface of the LED has been roughened, preferably in alignment with the openings in the contact. This may be achieved by etching the GaN in a self-aligned fashion during the same lithographic step used to pattern the contact. The etched holes can extend into the p-layer 20 or can be etched as deep as the substrate 8. The roughened surface scatters light in the semiconductor layers (light that would otherwise be trapped due to total internal reflection). Some of the light is reflected into angles where it escapes, thereby increasing the extraction efficiency of the LED.

The AlInGaN device may also include alloys of AlInGaN that have phosphorous or arsenic substituted for a fraction of the nitrogen. The finely patterned reflective contact may also be used on an AlInGaN LED having a vertical geometry, e.g. an LED with a p-contact on one side of the chip and an n-contact on another. The invention may be used with a roughened substrate-epitaxial layer interface, e.g., using a substrate that has been intentionally-roughened or textured prior to growth of the GaN to provide light scatter.

What is claimed is:

1. A method for patterning a contact of a light-emitting device comprising the steps of:

depositing an electrically conductive material on a hetero-junction device being operative to emit visible light at a wavelength $\lambda$, wherein said hetero-junction device has a p-type layer having a thickness of less than 2 microns; and patterning a first contact from the electrically-conductive material such that said first contact has openings that have a minimum width of ¼ $\lambda$;

wherein said first contact contains a metal selected from the group consisting of silver, rhodium, aluminum, and alloys thereof.

2. The method of patterning a light-emitting device, as defined in claim 1, the step of patterning the electrically conductive material comprises the steps of:

annealing the hetero-junction device;

depositing and exposing a resist to define the pattern of openings;

etching the pattern of openings into the electrically conductive material; and removing the resist.

3. A method of patterning a contact of a light-emitting device comprising the steps of:

depositing an electrically conductive material on a hetero-junction device being operative to emit visible light at a wavelength $\lambda$ and patterning a first contact from said electrically-conductive material such that the first contact has openings that have a minimum width of ¼ $\lambda$, said patterning comprising the steps of:

annealing the hetero-junction device;

depositing and exposing a resist to define the pattern of openings;

ion milling the pattern into the top surface of said hetero-junction device; and removing the resist.

4. A method of patterning a contact of a light-emitting device, said method comprising the steps of:

depositing an electrically conductive material on a hetero-junction device being operative to emit visible light at a wavelength $\lambda$;

patterning a first contact from the electrically-conductive material such that the first contact has openings that have a minimum width of ¼ $\lambda$; and depositing a dielectric encapsulant over said contact having a pattern of openings.

5. A method for patterning a contact of a light-emitting device, said method comprising the steps of:

depositing an electrically conductive material on a hetero-junction device being operative to emit visible light at a wavelength $\lambda$; and annealing said first contact at elevated temperatures so that surface tension causes openings to form in the material, wherein each of said openings has a minimum width of ¼ $\lambda$.

\* \* \* \* \*